United States Patent [19]

Smeltzer

[11] Patent Number: 4,897,366
[45] Date of Patent: Jan. 30, 1990

[54] METHOD OF MAKING SILICON-ON-INSULATOR ISLANDS

[75] Inventor: Ronald K. Smeltzer, Princeton, N.J.

[73] Assignee: Harris Corporation, Melbourne, Fla.

[21] Appl. No.: 298,148

[22] Filed: Jan. 18, 1989

[51] Int. Cl.[4] .................... H01L 21/00; H01L 21/02; H01L 21/205; H01L 21/306

[52] U.S. Cl. .......................... 437/83; 437/60; 437/84; 437/225; 437/249; 148/DIG. 150

[58] Field of Search ............... 437/60, 61, 83, 84, 437/225; 148/DIG. 150, DIG. 151

[56] References Cited

U.S. PATENT DOCUMENTS

| | | | |
|---|---|---|---|
| 4,016,016 | 4/1977 | Ipri | 437/99 |
| 4,249,960 | 2/1981 | Schnable et al. | 437/173 |
| 4,496,418 | 1/1985 | Ham | 156/643 |
| 4,522,662 | 6/1985 | Bradbury et al. | 437/90 |
| 4,549,926 | 10/1985 | Corboy, Jr. et al. | 437/62 |
| 4,578,142 | 3/1986 | Corboy, Jr. et al. | 156/644 |
| 4,615,762 | 10/1986 | Jastrzebski et al. | 437/62 |
| 4,637,127 | 1/1987 | Kurogi et al. | 437/60 |

OTHER PUBLICATIONS

Smeltzer, R., Dielectric Integrity of the Gate Oxide in RCA Review, vol. 45, Jun. 1984.

*Primary Examiner*—Brian E. Hearn
*Assistant Examiner*—B. Everhart
*Attorney, Agent, or Firm*—K. R. Glick

[57] ABSTRACT

A silicon-on-insulator (SOI) semiconductor device is made by forming a layer of single crystalline silicon on the surface of an insulating substrate. Portions of the silicon layer are removed, such as by etching, to form islands of the single crystalline silicon on the substrate with the islands having sharp corners between their side walls and their top surface. The silicon islands are then exposed to vapors of hydrogen chloride which etch the corners and form the islands with smooth, rounded corners between the side walls and the top surface.

12 Claims, 1 Drawing Sheet

METHOD OF MAKING SILICON-ON-INSULATOR ISLANDS

FIELD OF THE INVENTION

The present invention relates to a method of making improved silicon-on-insulator (SOI) islands, and, more particularly, to a method of making SOI islands having smooth, rounded corners between the side walls and the top surface of the islands.

BACKGROUND OF THE INVENTION

A type of silicon-on-insulator (SOI) semiconductor device comprises a substrate of an insulating material, such as sapphire or silicon oxide, having islands of single crystalline silicon thereon. Various semiconductor devices, such as transistors, are formed in the islands and are electrically connected to form a desired circuit. The islands are formed by forming a layer of single crystalline silicon on the insulating substrate, covering the portion of the silicon layer which are to form the islands with a masking material, and then removing the portions of the silicon layer not covered by the masking layer. The uncovered portions of the silicon layer can be removed by various techniques, such as by a wet chemical etch or by a plasma etch.

FIG. 1 shows a silicon island 10 on an insulating substrate 12 of sapphire which island 10 was formed by a wet chemical etch. This etching technique leaves the island 10 with sharp corners 14 between the tapered sides walls 16 and the top surface 18. FIG. 2 shows a silicon island 20 on a sapphire substrate 22 formed by a plasma etch. This technique also provides the island 20 with sharp corners 24 between the straight vertical side walls 26 and the top surface 28. The sharp corners provide regions of very high electric field which results in a significant limitation to the dielectric integrity of the channel oxide of a MOS transistor formed in the island. In order to delete this high field region it would be desirable to remove the sharp corners and form the islands with rounded corners. Past approaches to the creation of such a rounded corner are described in the article "Dielectric Integrity of the Gate Oxide in SOS Devices", by R. K. Smeltzer et al published in RCA REVIEW, Vol. 45, June, 1984, pages 194–229. However, rounding the corners by means of a wet chemical etching operation provides a very rough surface so that no significant improvement in electrical properties was achieved. Likewise plasma etching provides corners having a rough surface. Therefore, it would be desirable to have a method of forming the silicon islands with rounded corners which are smooth.

SUMMARY OF THE INVENTION

The present invention relates to a method of forming an island of single crystalline silicon on a substrate of insulating material wherein the island is first formed with sharp corners between the side walls of the island and the top surface. The island is then exposed to vapors of hydrogen chloride to round the corners and provide them with a smooth surface.

DETAILED DESCRIPTION OF PREFERRED EMBODIMENT

Figure 3:
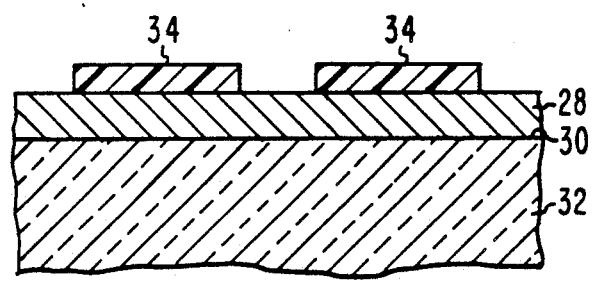
FIG. 3 is a sectional view illustrating the first set of the method of the present invention.

Referring to FIG. 3, the method of the present invention starts with the forming of a layer 28 of single crystalline silicon on the surface 30 of a wafer 32 of an insulating material. As shown, the wafer 32 is of sapphire with the silicon layer 28 being epitaxially deposited thereon. However, the wafer 32 can be a layer of an insulating material, such as silicon oxide, on a substrate, such as of silicon. For such a wafer, the single crystalline silicon layer 28 can be deposited as amorphous or polycrystalline silicon and converted to single crystalline silicon by the well known zone melting and recrystallization technique. A masking layer 34, such as of a resist material, is coated on the single crystalline silicon layer 28. The masking layer 34 is defined, such as by standard photolithographic techniques, to cover only the areas of the silicon layer 28 which are to form the islands of the SOI device.

Figure 1:
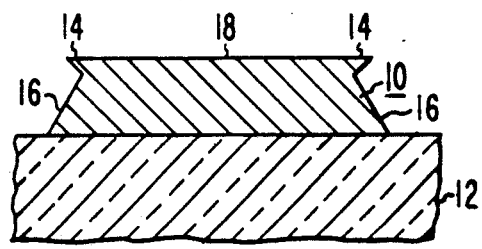
FIG. 1 is a sectional view of a SOI silicon island formed by prior known wet chemical etching technique.
Figure 2:
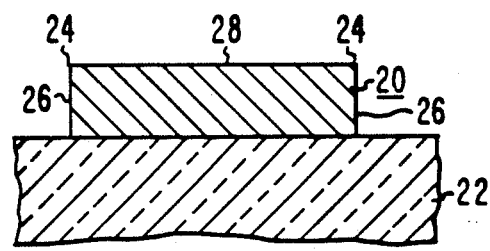
FIG. 2 is a sectional view of a SOI silicon island formed by prior known dry plasma etching technique.

The uncovered portions of the silicon layer 28 are then removed, such as by etching, down to the surface 30 of the wafer 32. If a wet chemical etching technique is used, the islands will have tapered side walls and sharp corners between the side walls and the top surface as shown in FIG. 1. If the silicon layer 28 is etched by a dry plasma etching technique, the islands will have walls substantially perpendicular to the wafer surface 30 and sharp corners between the side walls and the top surface as shown in FIG. 2.

Figure 4:
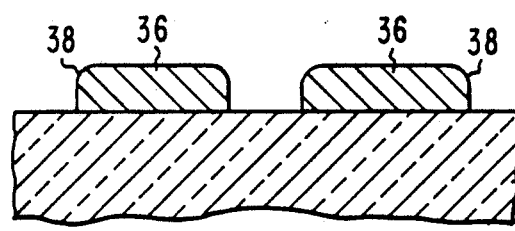
FIG. 4 is a sectional view illustrating the step of the method of the present invention of rounding the corners of the silicon islands.

The masking layer 34 is then removed with a suitable solvent and the device is exposed to vapors of hydrogen chloride (HCl). The hydrogen chloride is preferably a 0.25% concentration in hydrogen and is at a temperature of between 930° C. and 970° C. with 950° C. being preferred. The silicon islands are exposed to the hydrogen chloride vapors for a period of 10 to 30 minutes. Preferably, the silicon islands are exposed to the hydrogen chloride vapors for about 10 minutes. This exposure etches the sharp corners of the islands 36 so that the corners 38 are not only rounded, as shown in FIG. 4, but are also smooth.

Figure 5:
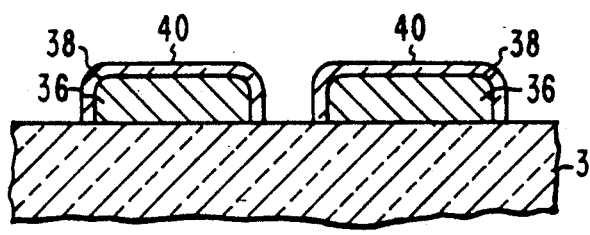
FIG. 5 is a sectional view illustrating the final step of the method of the present invention.

As shown in FIG. 5, the islands 36 are then covered with a layer 40 of silicon oxide. This can be achieved by exposing the islands 36 to oxygen while heating the islands to a temperature at which the silicon oxidizes and forms at the surface of the islands the layer 40 of silicon oxide. Electrical components, such as MOS transistors, can then be formed in the islands 36. Since the corners 38 of the islands 36 are smooth and rounded, high electrical fields through the silicon oxide layer 40 are avoided. Thus, there is provided by the present invention, a method of making SOI integrated circuits in which the corners of the silicon islands can be easily and quickly provided with smooth, rounded corners between the side walls and top surface of the islands so as to minimize high electrical fields at such corners.

I claim:

1. In a method of forming an island of single crystalline silicon on an insulating substrate wherein the island is formed on the substrate with sharp corners between the side walls and the top surface of the island, the improvement comprising:

exposing the island to vapors of hydrogen chloride at a temperature of between 930° C. and 970° C. to round the corners of the islands.

2. A method in accordance with claim 1 in which the hydrogen chloride vapors are at a temperature of about 950° C.

3. A method in accordance with claim 2 in which the islands are exposed to the hydrogen chloride for a period of 10 to 30 minutes.

4. A method in accordance with claim 3 in which the islands are exposed to the hydrogen chloride for a period of about 10 minutes.

5. A method in accordance with claim 3 in which the hydrogen chloride vapors are at a concentration of 0.25% in hydrogen.

6. A method of making a silicon-on-insulator semiconductor device comprising the steps of:

forming a layer of single crystalline silicon on the surface of an insulating substrate;

covering portions of the silicon layer with a layer of a masking material;

removing the exposed portions of the silicon layer to form at least one island of the single crystalline silicon having side walls and a top surface with sharp corners between the side walls and the top surface; and exposing the silicon island to vapors of hydrogen chloride at a temperature of between 930° C. to 970° C. to form the island with smooth rounded corners between the side walls and the top surface.

7. A method in accordance with claim 6 in which the hydrogen chloride vapors are at a temperature of about 950° C.

8. A method in accordance with claim 7 in which the island is exposed to the hydrogen chloride vapors for a period of 10 to 30 minutes.

9. A method in accordance with claim 8 in which the island is exposed to the hydrogen chloride vapors for a period of about 10 minutes.

10. A method in accordance with claim 7 in which the hydrogen chloride vapors are at a concentration of 0.25% in hydrogen.

11. A method in accordance with claim 6 in which the masking material is removed before exposing the island to the hydrogen chloride vapors.

12. A method in accordance with claim 6 in which the uncovered portions of the silicon layer are removed by an etching technique.

* * * * *